United States Patent

Maeda

[11] Patent Number: 5,881,000
[45] Date of Patent: Mar. 9, 1999

[54] SEMICONDUCTOR MEMORY DEVICE HAVING BOOSTER SUPPLYING STEP-UP VOLTAGE EXCLUSIVELY TO OUTPUT CIRCUIT FOR BURST

[75] Inventor: Kazunori Maeda, Tokyo, Japan

[73] Assignee: NEC Corporation, Tokyo, Japan

[21] Appl. No.: 120,739

[22] Filed: Jul. 23, 1998

[30] Foreign Application Priority Data

Jul. 25, 1997 [JP] Japan ................................. 9-216024

[51] Int. Cl.⁶ .................................................. G11C 7/00
[52] U.S. Cl. ................................ 365/189.09; 365/189.05
[58] Field of Search .......................... 365/189.09, 189.11, 365/189.05

[56] References Cited

U.S. PATENT DOCUMENTS

| 5,521,871 | 5/1996 | Choi ................................ | 365/189.11 |
| 5,528,538 | 6/1996 | Sakuta et al. ..................... | 365/189.09 |
| 5,677,889 | 10/1997 | Haraguchi et al. ................ | 365/189.09 |

FOREIGN PATENT DOCUMENTS

8-50789   2/1996   Japan.

*Primary Examiner*—Vu A. Le
*Attorney, Agent, or Firm*—Sughrue, Mion, Zinn, Macpeak & Seas, PLLC

[57] ABSTRACT

A semiconductor synchronous dynamic random access memory device supplies a series of data bits to an external device through a burst access; a first boosting circuit produces a first boosted voltage from a pulse signal internally generated by a ring oscillator, a second boosting circuit produces a second boosted voltage from a system clock, and the output node of the first boosting circuit is electrically connected to the output node of the second boosting circuit; while an output circuit is producing an output data signal from read-out data bits in synchronism with the system clock during the burst access, the second boosting circuit pumps electric charge to the output circuit in synchronism with the system clock so as to stably supply the second boosted voltage, and the output circuit converts the read-out data bits to the output data signal at high-speed.

10 Claims, 9 Drawing Sheets

SEMICONDUCTOR MEMORY DEVICE HAVING BOOSTER SUPPLYING STEP-UP VOLTAGE EXCLUSIVELY TO OUTPUT CIRCUIT FOR BURST

FIELD OF THE INVENTION

This invention relates to a semiconductor memory device and, more particularly, to a semiconductor synchronous dynamic random access memory device having boosters supplying step-up voltage to a word line driver and an output circuit.

DESCRIPTION OF THE RELATED ART

Figure 1:
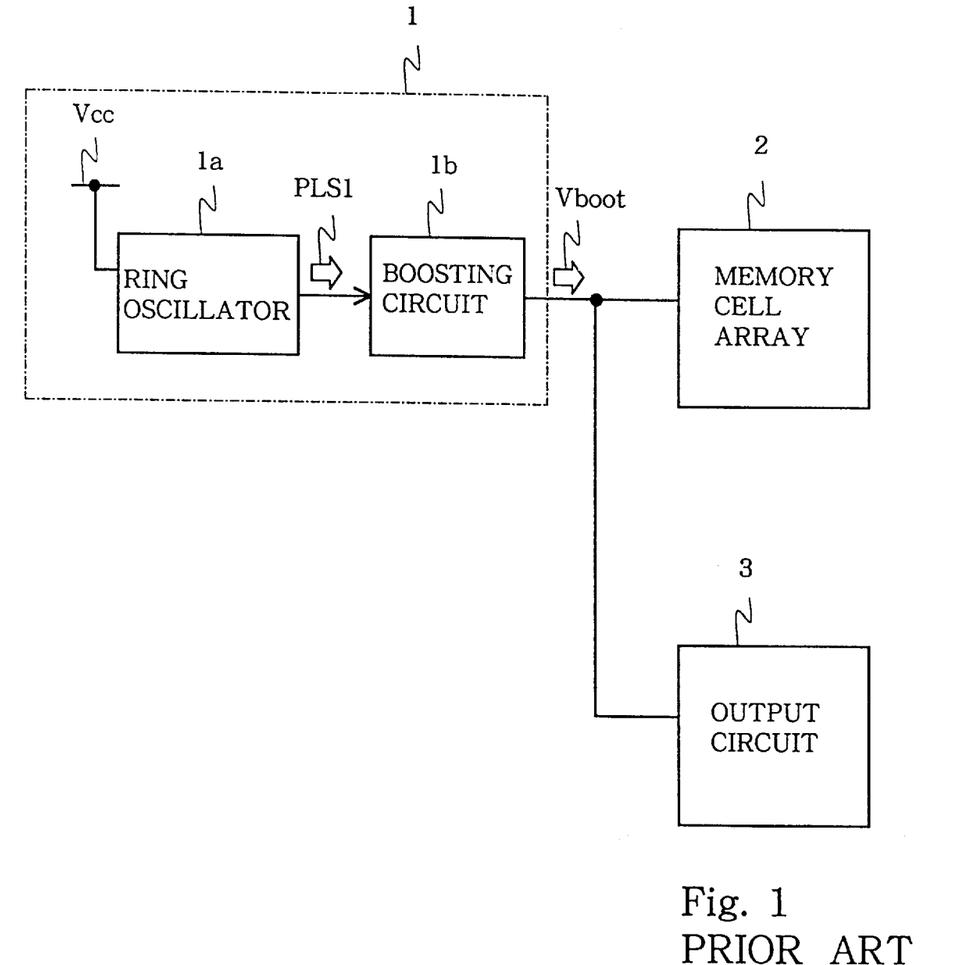
FIG. 1 is a block diagram showing the electric power distribution system incorporated in the prior art semiconductor synchronous dynamic random access memory device.

Device manufacturers have decreased the magnitude of electric power for the semiconductor dynamic random access memory device. However, certain components still require higher voltage, and a semiconductor dynamic random access memory device is equipped with a step-up circuit. FIG. 1 illustrates an electric power distribution system 1 incorporated in a prior art synchronous dynamic random access memory device. The electric power distribution system 1 comprises a ring oscillator 1a and a boosting circuit 1b. The ring oscillator 1a is powered with a positive power voltage Vcc, and periodically alters the potential level at the output node thereof between the positive power voltage Vcc and the ground voltage so as to generate a pulse signal PSL1. The pulse signal PSL1 is supplied to the boosting circuit 1b, and the boosting circuit 1b produces a step-up voltage Vboot from the pulse signal PLS1.

The pulse signal PLS1 is supplied to a memory cell array 2 and an output circuit 3. The memory cell array 2 includes a word line driver (not shown), and the word line driver selectively changes word lines (not shown) to the boosted voltage level so as to electrically connect the storage capacitors to the associated bit lines.

Figure 2:
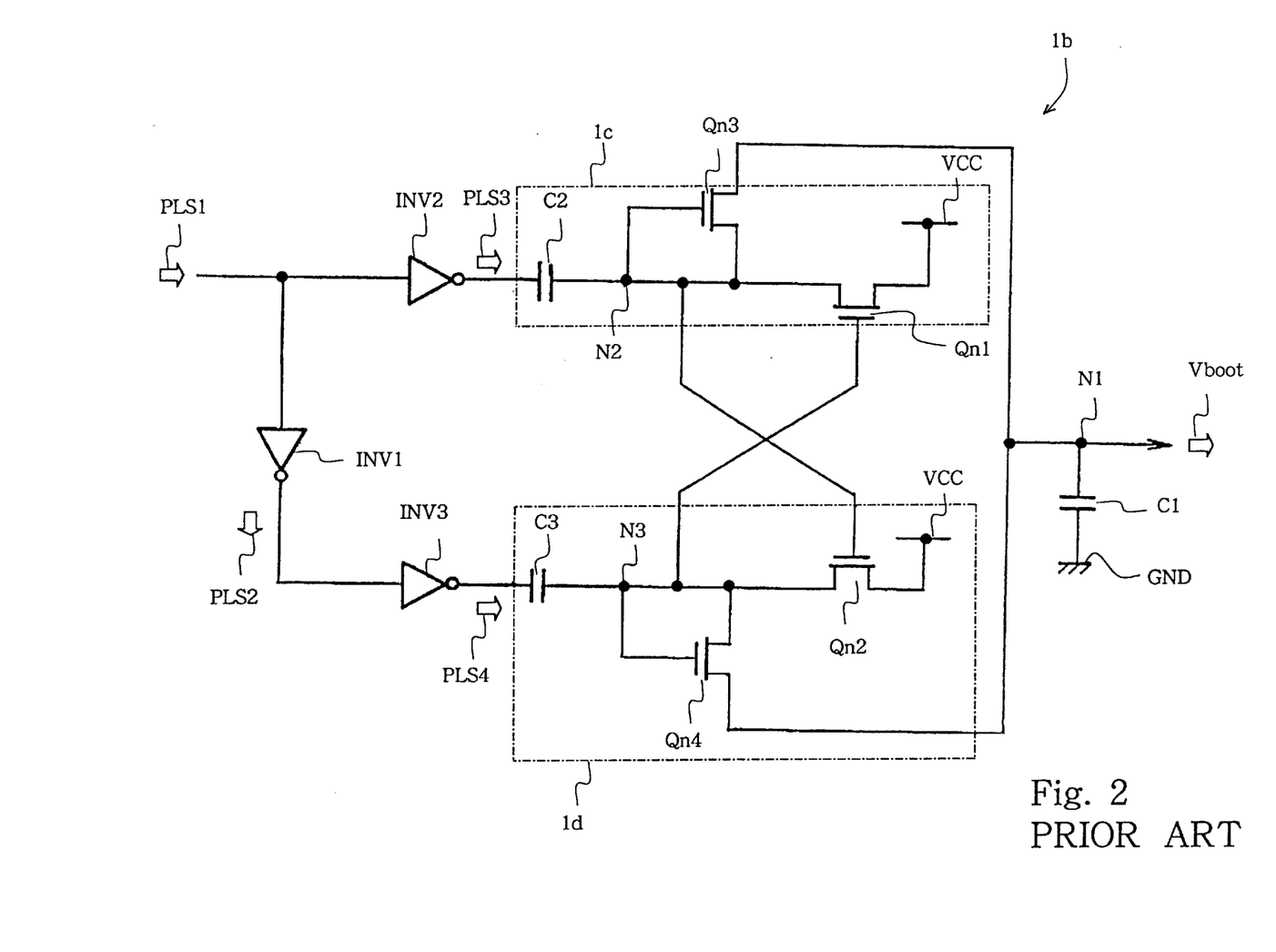
FIG. 2 is a circuit diagram showing the circuit configuration of the prior art boosting circuit.

The circuit configuration of the boosting circuit 1b is illustrated in FIG. 2. The prior art boosting circuit 1b includes an inverter INV1 and two inverters INV2/INV3. The pulse signal PLS1 is supplied to the inverter INV1, and the inverter INV1 supplies a pulse signal PLS2 complementary to the pulse signal PLS1 to the inverter INV3. The pulse signals PLS1/PLS2 are respectively supplied to the inverters INV2/INV3, and the inverters INV2/INV3 respectively produce pulse signals PLS3/PLS4 complementary to each other.

The prior art boosting circuit 1b further includes boosters 1c/1d connected between the inverters INV2/1NV3 and an output node N1 and a smoothing capacitor C1 connected between the output node N1 and a ground line GND. The boosters 1c/1d alternately supply the boosted voltage Vboot to the smoothing capacitor C1, and the boosted voltage Vboot is distributed from the smoothing capacitor C1 to the memory cell array 2 and the output circuit 3. The smoothing capacitor C1 is large enough to decrease the pulsation of the boosted voltage Vboot.

The booster 1c/1d includes a bootstrap capacitor C2/C3 connected between the inverter INV2/INV3 and a boosting node N2/N3, an n-channel enhancement type switching transistor Qn1/Qn2 connected between a power supply line VCC and the boosting node N2/N3 and an n-channel enhancement type switching transistor Qn3/Qn4 connected between the boosting node N2/N3 and the smoothing capacitor C1. The boosting node N2/N3 is connected to the gate electrode of the n-channel enhancement type switching transistor Qn3 and the gate electrode of the n-channel enhancement type switching transistor Qn2. Qn1.

Figure 3:
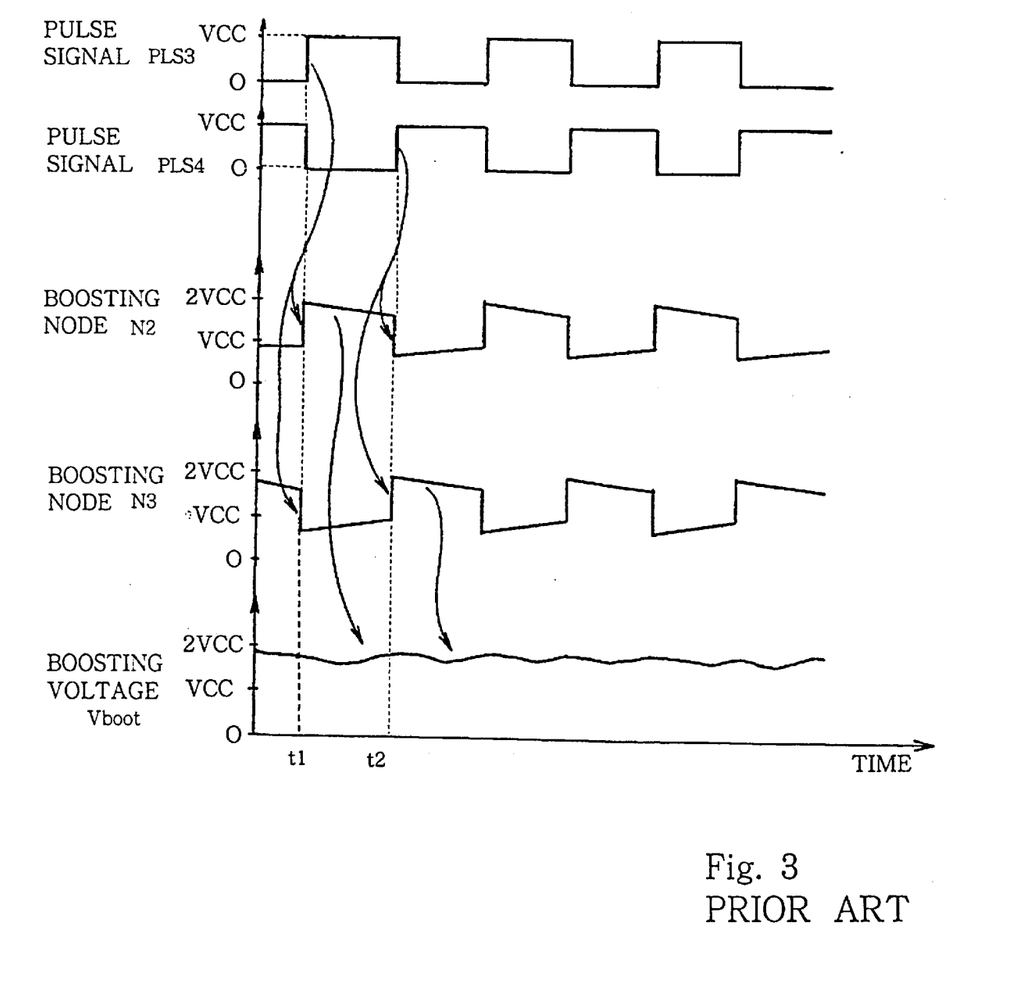
FIG. 3 is a graph showing the bootstrap operation of the prior art boosting circuit.

The prior art boosting circuit 1b behaves as follows. FIG. 3 illustrates the bootstrap operation. The boosting node N3 has been already charged to the power voltage level Vcc, and the other boosting node N2 has been already boosted over the power voltage level Vcc. The boosting node N3 causes the n-channel enhancement type switching transistor Qn1 to turn on, and the n-channel enhancement type switching transistor Qn3 is turned off. The n-channel enhancement type switching transistor Qn2 is turned off, and the n-channel enhancement type switching transistor Qn4 is turned on. The output node N1 is being gradually decayed.

The pulse signal PLS3 is changed to the positive power voltage level Vcc at time t1, and, accordingly, the pulse signal PLS4 concurrently falls to the ground level. The bootstrap capacitor C2 lifts the boosting node N2 toward a certain level 2Vcc approximately twice higher than the positive power voltage level Vcc. The n-channel enhancement type switching transistor Qn1 turns off, and the n-channel enhancement type switching transistor Qn4 also turns off. The boosting node N2 causes the n-channel enhancement type switching transistor Qn2 to turn on, and the other boosting node N3 is charged to the positive power voltage level Vcc. When the boosting node N2 exceeds the total of the boosted voltage level Vboot and the threshold Vthn thereof, i.e., (Vboot+Vthn), the n-channel enhancement type switching transistor Qn3 turns on, and the boosted voltage Vboot is supplied from the bootstrap capacitor C2 through the n-channel enhancement type switching transistor Qn3 to the output node N1. As a result, the boosting node N2 is being gradually decayed.

The pulse signal PLS4 is changed to the positive power voltage level Vcc at time t2, and, accordingly, the pulse signal PLS3 concurrently falls to the ground level. The bootstrap capacitor C3 lifts the boosting node N3 toward the certain level 2Vcc. The n-channel enhancement type switching transistor Qn2 turns off, and the n-channel enhancement type switching transistor Qn3 also turns off. The boosting node N3 causes the n-channel enhancement type switching transistor Qn1 to turn on, and the boosting node N2 is charged to the positive power voltage level Vcc. When the boosting node N3 exceeds the total of the boosted voltage level Vboot and the threshold Vthn thereof, i.e., (Vboot+Vthn), the n-channel enhancement type switching transistor Qn4 turns on, and the boosted voltage Vboot is supplied from the bootstrap capacitor C3 through the n-channel enhancement type switching transistor Qn4 to the output node N1. As a result, the boosting node N3 is being gradually decayed. In this way, the boosters 1c/1d alternately supply the boosted voltage Vboot to the output node N1, and the boosted voltage Vboot is smoothened by the smoothing capacitor C1.

Figure 4:
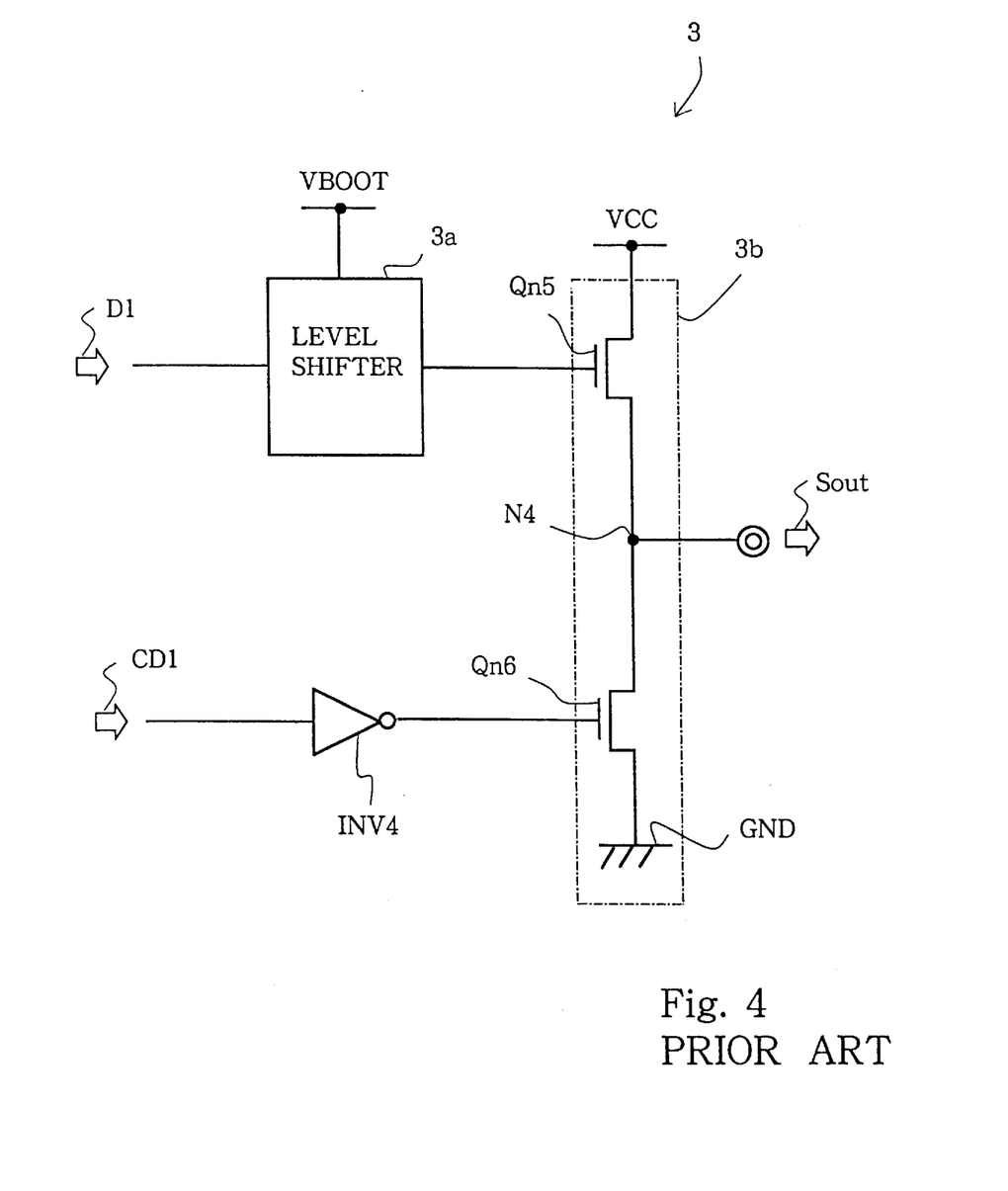
FIG. 4 is a circuit diagram showing the circuit configuration of the output circuit incorporated in the prior art semiconductor dynamic random access memory device.

FIG. 4 illustrates the circuit configuration of the output circuit 3. The output circuit 3 includes a level shifter 3a, an inverter INV4 and an output driver 3b. A series combination of n-channel enhancement type switching transistors Qn5/Qn6 serves as the output driver 3b, and is connected between the positive power voltage line VCC and the ground line GND. An output data bit D1 and the complementary data bit CD1 are supplied to the level shifter 3a and the inverter INV4, and the level shifter 3a changes the potential range of the output data bit D1. The level shifter 3a and the inverter INV4 complementarily change the n-channel enhancement type switching transistors Qn5/Qn6 between on-state and off-state, and outputs an output data signal Sout from an output node N4. The read-out data bits D1/CD1 are successively supplied to the output circuit 3 in synchronism with a system clock, and the output circuit 3 maintains or changes the logic level of the output data signal Sout depending upon the read-out data bit.

Figure 5:
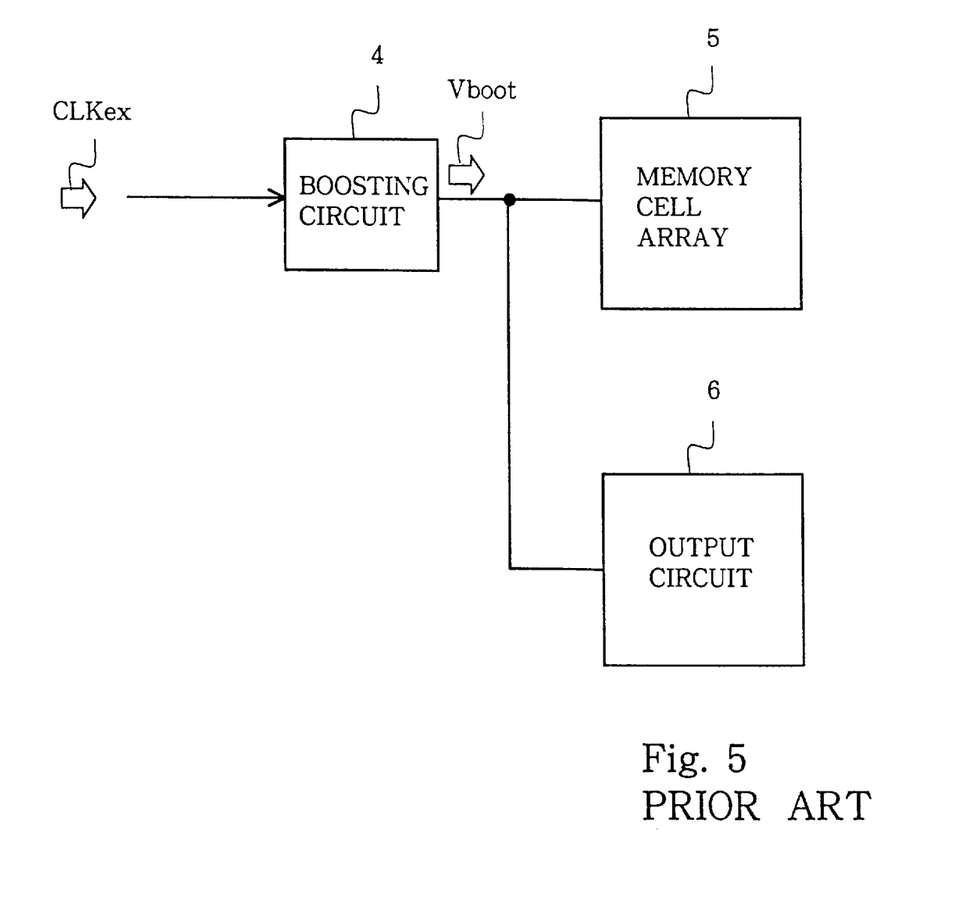
FIG. 5 is a circuit diagram showing the circuit configuration of the prior art power distribution system disclosed in Japanese Patent Publication of Unexamined Application No. 8-50789.

Another prior art power distribution system is disclosed in Japanese Patent Publication of Unexamined Application No. 8-50789. The prior art power distribution system is simply implemented by the boosting circuit 4, and the boosting circuit 4 generates a boosted voltage Vboot from a system clock CLKex supplied from the outside of the prior art semiconductor synchronous dynamic random access memory device. The boosting circuit 4 distributes the boosted voltage Vboot to a memory cell array 5 and an output circuit 6. Read-out data bits are successively supplied to the output circuit 6 in synchronism with the system clock CLKex, and the output circuit 6 changes or maintains the logic level of the output data signal depending upon the read-out data bit.

A problem is encountered in both prior art semiconductor synchronous dynamic random access memory devices in that the read-out data bits do not appear at the output node at expected timings. In other words, the read-out data bits are delayed.

SUMMARY OF THE INVENTION

It is therefore an important object of the present invention to provide a semiconductor memory device, which outputs read-out data bits at high speed.

The present inventor contemplated the problem, and noticed that the output circuit 3/6 decayed the boosted voltage Vboot during the data output operation. While the output circuit 3/6 was waiting for the read-out data bit D1/CD1, the boosted voltage Vboot was only consumed by the word line driver, and the boosting circuit could maintain the boosted voltage at the suitable level. However, when the output circuit 3/6 started to produce the output data signal Sout from the read-out data bit D1/CD1, not only the word line driver but also the output circuit 3/6 consumed the boosted voltage Vboot, and the power consumption exceeded over the capability of the boosting circuit 1/4. The word line driver consumed long time to lift the selected word line, and the output driver 3b also consumed long time to invert the output data signal Sout. Especially, there is no guarantee that the pumping timings t1/t2 . . . were matched with the data output timings in the prior art shown in FIG. 1, and the difference prolonged the data read-out. On the other hand, the prior art semiconductor synchronous dynamic random access memory device produced the boosted voltage from the external clock CLKex, and the pumping timing was matched with the system clock CLKex. The boosting circuit 1b promptly boosted the potential level at the output node N1, and fairly prevented the word line driver and the output circuit 6 from the speed-down. Even though pumping timing was matched with the data output timing, the system clock CLKex was usually constant during the self-refreshing, and the self-refreshing interrupted the boosting operation. When the prior art synchronous dynamic random access memory device was recovered from the self-refreshing, the boosting circuit 4 restarted the boosting, and the data access immediately after the recovery from the self-refreshing consumed time. The present inventor concluded that a boosted circuit was exclusively required for the output circuit.

In accordance with one aspect of the present invention, there is provided a semiconductor memory device comprising a first component including a plurality of addressable memory cells for respectively storing data bits, a second component connected to the first component for transferring the data bits between the first component and the outside of the semiconductor memory device and a third component including a first step-up circuit connected to the first component and producing a first step-up voltage higher than an external power voltage for supplying the first step-up voltage from an output node thereof to the first component, a second step-up circuit connected to the second component and producing a second step-up voltage higher than the external power voltage for supplying the second step-up voltage from an output node thereof to the second component and a conductive line electrically connecting the output node of the first step-up circuit and the output node of the second step-up circuit.

BRIEF DESCRIPTION OF THE DRAWINGS

The features and advantages of the semiconductor memory device will be more clearly understood from the following description taken in conjunction with the accompanying drawings in which.

DESCRIPTION OF THE PREFERRED EMBODIMENTS

First Embodiment

Figure 6:
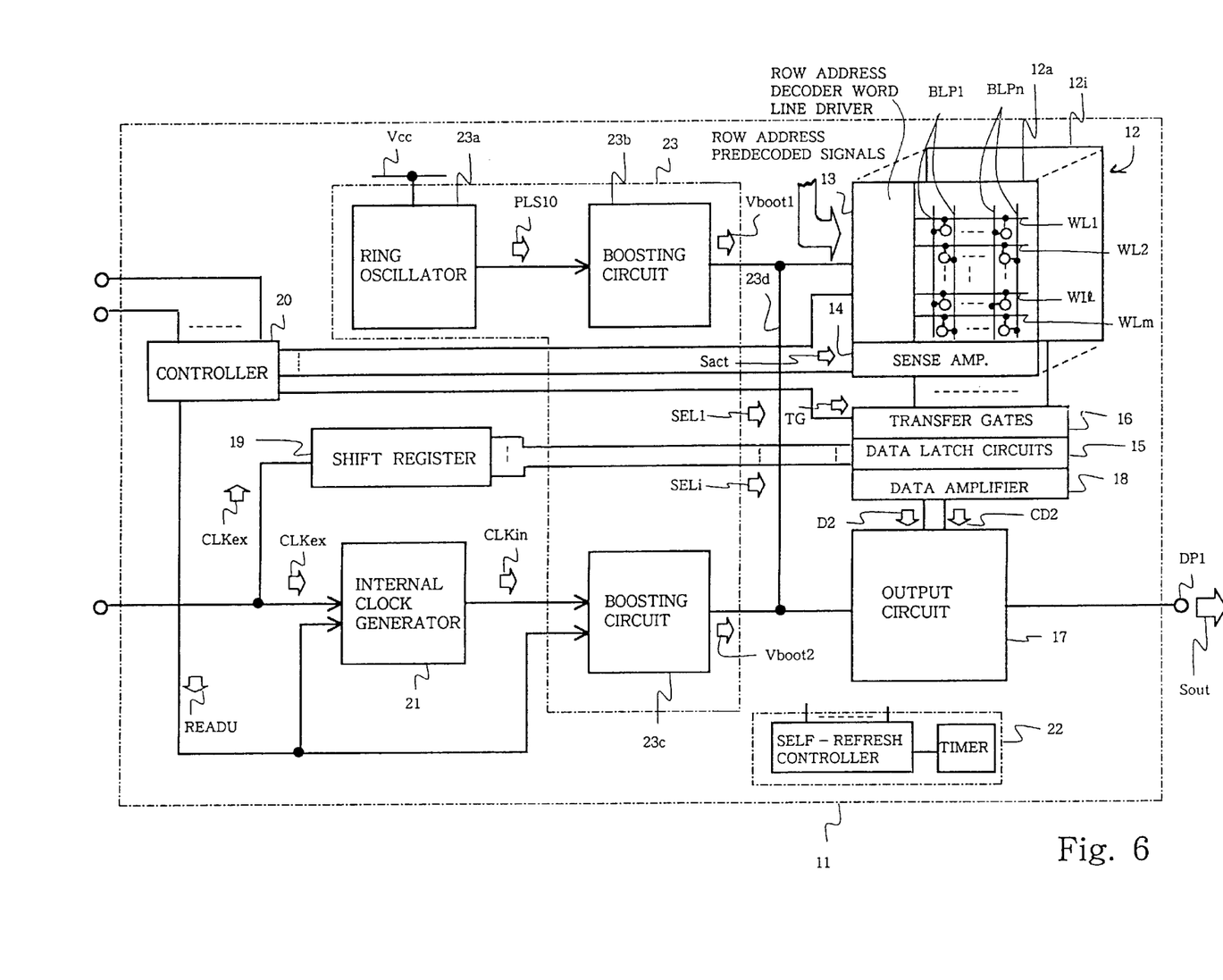
FIG. 6 is a block diagram showing the arrangement of a semiconductor synchronous dynamic random access memory device according to the present invention.

Referring to FIG. 6 of the drawings, a semiconductor synchronous dynamic random access memory device embodying the present invention is fabricated on a single semiconductor chip 11. The semiconductor synchronous dynamic random access memory device comprises a memory cell array 12 for storing data bits. The memory cell array 12 is divided into plural memory cell sub-arrays 12a to 12i, and dynamic memory cells form each of the memory cell sub-arrays 12a to 12i. The dynamic memory cell is implemented by a series combination of an n-channel enhancement type access transistor and a storage capacitor, and stores a data bit in the form of electric charge. The dynamic memory cells are arranged in rows and columns, and are represented by small bubbles in FIG. 6.

The rows of dynamic memory cells are respectively connected to word lines WL1, WL2, ... WL1 and WLm, and the word lines WL1 to WLm are shared between the memory cell sub-arrays 12a to 12i. Bit line pairs BLP1 to BLPn are respectively connected to the columns of dynamic memory cells, and each memory cell sub-array 12a to 12i is associated with a set of bit line pairs BLP1 to BLPn.

The semiconductor synchronous dynamic random access memory device further comprises a row address decoder/word line driver 13 connected to the word lines WL1 to WLm and sense amplifier units 14 connectable to the bit line pairs BLP1 to BLPn. The sense amplifier units 14 are respectively provided for the memory cell sub-arrays 12a to 12i, and a selector (not shown) is connected between the bit line pairs BLP1 top BLPn and each sense amplifier unit 14. For this reason, each of the sense amplifier units 14 is selectively connected to the bit line pairs BLP1 to BLPn of the associated set, and is responsive to an activation signal Sact so as to increase the magnitude of a potential difference representative of a data bit.

The semiconductor synchronous dynamic random access memory device further comprises data latch circuits 15 for temporarily storing data bits, transfer gates 16 connected between the sense amplifier units 14 and the data latch circuits 15, an output circuit 17 connected to a data port DP1, a data amplifier 18 connected between the data latch circuits 15 and the output circuit 17 and a shift register 19 connected to the data latch circuits 15. The transfer gates 16 are responsive to a gate control signal TG so as to transfer data bits from the sense amplifier units 14 to the data latch circuits 15. The shift register 19 sequentially changes selecting signals SEL1 to SELi to the active level in synchronism with a system clock signal CLKex, and the selecting signals SEL1 to SELi cause the data latch circuits 15 to supply a read-out data signal D2 and the complementary signal CD2 representative of each data bit from the data latch circuits 15 to the data amplifier 18. The data amplifier 18 increases the potential difference between the read-out data signal D2 and the complementary signal CD2, and supplies them to the output circuit 17. The output circuit 17 may have the circuit configuration shown in FIG. 4. Thus, read-out data bits are transferred from the sense amplifier units 14 through the transfer gates 16 to the data latch circuits 15, and are serially transferred from the data latch circuits 15 through the data amplifier 18 to the output circuit 17. The data access for a series of data bits is called as "burst access".

The semiconductor synchronous dynamic random access memory device further comprises a controller 20, an internal clock generator 21 and a self-refreshing system 22 for refreshing data bits stored in the dynamic memory cells. The controller 20 produces internal control signals such as the activation signal Sact and the gate control signal TG on the basis of external instructions, and the internal clock generator 21 produces an internal clock signal CLKin from the system clock CLKex. The self-refreshing system 22 starts the self-refreshing after lapse of time from the last data access. The self-refreshing is well known to a person skilled in the art, and no further description is incorporated hereinbelow.

The semiconductor synchronous dynamic random access memory device further comprises a step-up voltage distributing system 23. The step-up voltage distributing system 23 includes a ring oscillator 23a for generating a pulse signal PLS10, a boosting circuit 23b for generating boosted voltage Vboot1 from the pulse signal PLS10, a boosting circuit 23c for generating boosted voltage Vboot2 from the internal clock signal CLKin and a conductive line 23d connected between the output node of the boosting circuit 23b and the output node of the other boosting circuit 23c. The boosting circuits 23b/23c have the circuit configuration shown in FIG. 2. While the semiconductor synchronous dynamic random access memory device is being powered with the positive power voltage Vcc, the ring oscillator 23a produces the pulse signal PLS10 which is chanced between the positive power voltage level Vcc and the ground level. The ring oscillator 23a supplies the pulse signal PLS10 to the boosting circuit 23b, and the ring oscillator 23a and the boosting circuit 23b behave as similar to the prior art shown in FIG. 3. For this reason, while the semiconductor synchronous dynamic random access memory device is being powered, the boosting circuit 23b supplies the boosted voltage Vboot to the word line driver 13.

Figure 7:
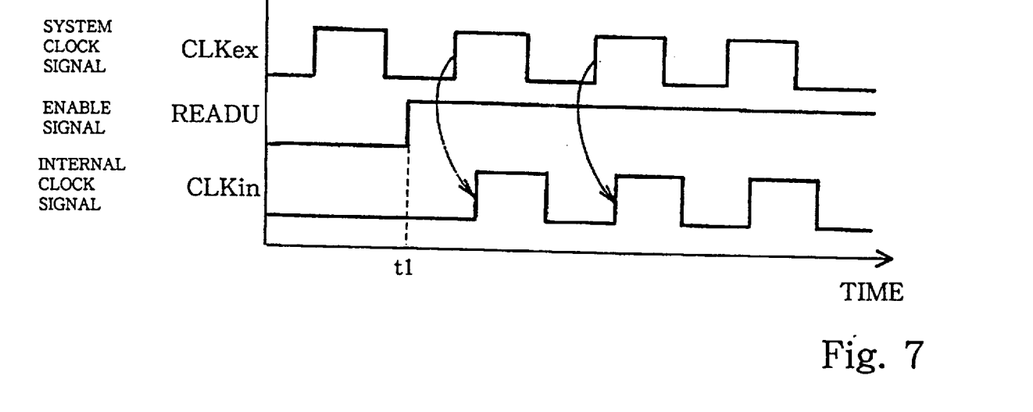
FIG. 7 is a graph showing the waveform of an internal clock signal produced from an internal generator incorporated in the semiconductor synchronous dynamic random access memory device.

The controller 20 changes an enable signal READU to the active level during a data read-out, and the internal clock generator 21 and the boosting circuit 23c are enabled with the enable signal READU. The output circuit 17 is required for the data read-out, and the internal clock generator 21 and the boosting circuit 23c are activated for supplying the boosted voltage Vboot to the output circuit 17. Namely, when an external device (not shown) requests the semiconductor synchronous dynamic random access memory device to supply data bits through a burst access, the controller 20 changes the enable signal READU to the active level at time t11 (see FIG. 7), and the internal clock generator 21 starts to generate the internal clock signal CLKin from the external clock signal CLKex. The internal clock signal CLKin is changed between the positive power voltage level Vcc and the ground level.

Both of the internal clock generator 21 and the shift register 19 are responsive to the external clock signal CLKex so as to produce the internal clock signal CLKin and the selecting signals SEL1- SELi in synchronism with the system clock signal CLKex. For this reason, the pumping timing in the boosting circuit 23c is matched with the serial data output timing, and the boosting circuit 23c stably supplies the boosted voltage Vboot2 to the output circuit 17 during the burst data access.

While the self-refreshing system 22 is carrying out the data refresh, the external clock signal CLKex is not supplied to the internal clock generator 21, and, accordingly, the boosting circuit 23c stops boosting the electric power. If the external device (not shown) requests a burst access to the semiconductor synchronous dynamic random access memory device during the data refreshing, the self-refreshing system 22 interrupts the data refreshing, and the controller 20 starts the burst access. The system clock CLKex is supplied to the internal clock generator 21, and the internal clock generator restarts to generate the internal clock signal CLKin. With the internal clock signal CLKin, the boosting circuit 23c generates the boosted voltage Vboot2. For this reason, there is time lag between the interruption of the self-refreshing and the development of the boosted voltage Vboot2. The controller 20 controls the sense amplifier units 14, the transfer gates and the data latch circuits 15 so as to successively transfer read-out data bits from the data latch circuits 15 through the data amplifier 18 to the output circuit 17, and the read-out data bits may reach the output circuit 17 before the sufficient development of the boosted voltage Vboot2. However, the boosting circuit 23b continuously generates the boosted voltage Vboot1 during the self-refreshing, and the boosted voltage Vboot1 reaches the output circuit 17 through the conductive line 23d. For this reason, even if the boosted circuit 23c has insufficiently developed the boosted voltage Vboot2, the other boosting circuit 23b supplies the boosted voltage Vboot1 through the conductive line 23d to the output circuit 17, and the output circuit 17 produces the output data signal Sout from the read-out data bits without time delay.

In this instance, the memory cell array 12, the row address decoder/word line driver 13, the sense amplifier units 14, the data latch circuits 15, the transfer gates 16, the data amplifier 18, the shift register 19, the controller 20 and the refreshing system 22 as a whole constitute a first component, and an input/output circuit including the output circuit 17 serves as a second component. The internal clock generator 21 and the step-up voltage distributing system 23 as a whole constitute a third component. The data latch circuits 15 and the shift register 19 form in combination a burst accessing means.

As will be understood from the foregoing description, the boosting circuit 23c pumps the electric charge to the output circuit 17 in synchronism with the system clock CLKex, and the boosted voltage Vboot2 is stably supplied to the output circuit 17 during the burst access. Moreover, the other boosting circuit 23b continuously applies the boosted voltage Vboot1 through the conductive line 23d to the output circuit 17 during the self-refreshing, and the output circuit 17 is responsive to read-out data bits immediately after the recovery from the self-refreshing without reduction of access speed.

Second Embodiment

Figure 8:
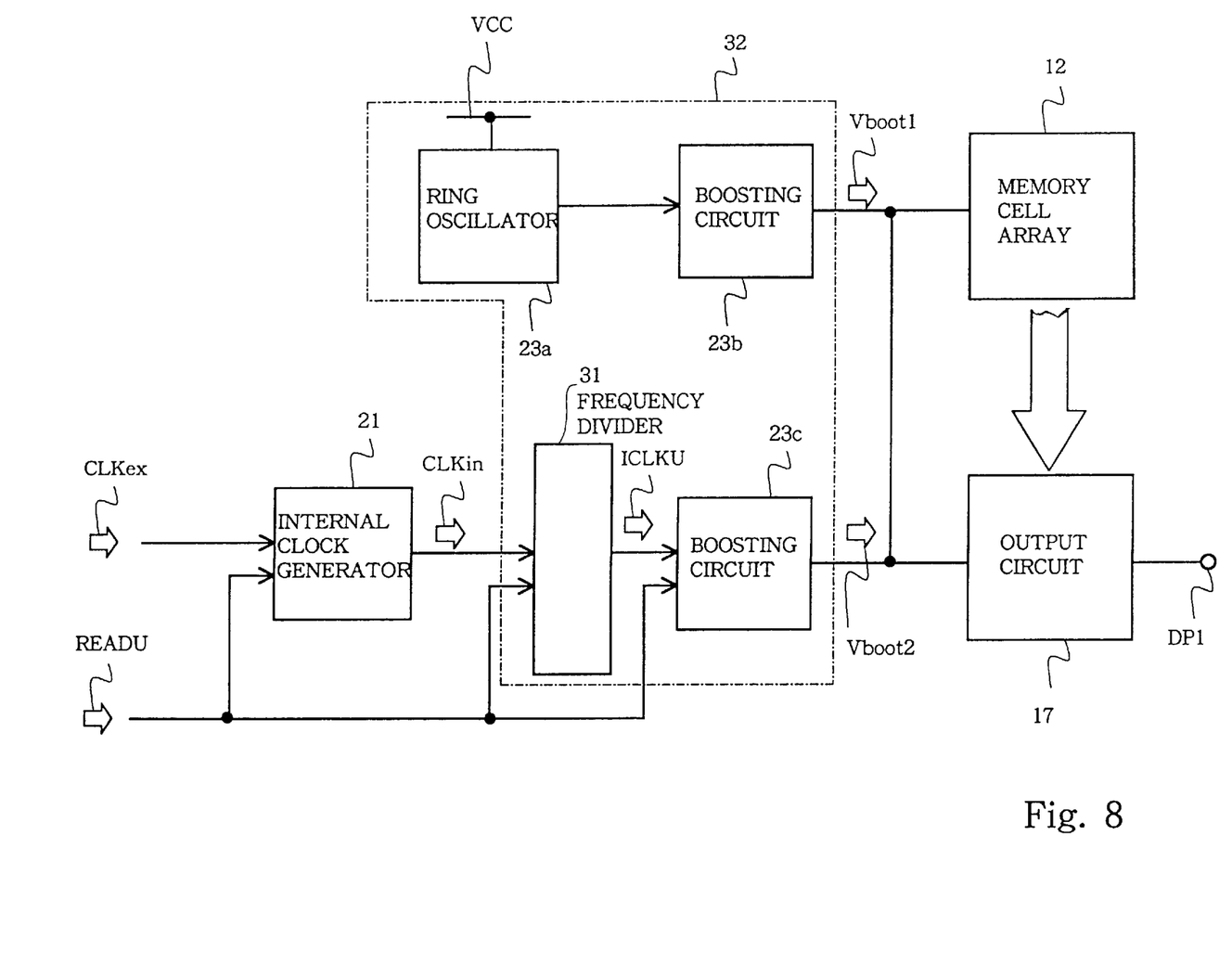
FIG. 8 is a block diagram showing the arrangement of another semiconductor synchronous dynamic random access memory device according to the present invention.

FIG. 8 illustrates another semiconductor synchronous dynamic random access memory device embodying the present invention. The semiconductor synchronous dynamic random access memory device implementing the second embodiment is similar in arrangement to the first embodiment except for a frequency divider 31. For this reason, the other components are labeled with the same references designating corresponding components of the first embodiment without detailed description. Although the memory cell array 12 is directly connected to the output circuit 17 in FIG. 8, the memory cell array 12 is accompanied with the above described circuits as similar to the first embodiment.

Figure 9:
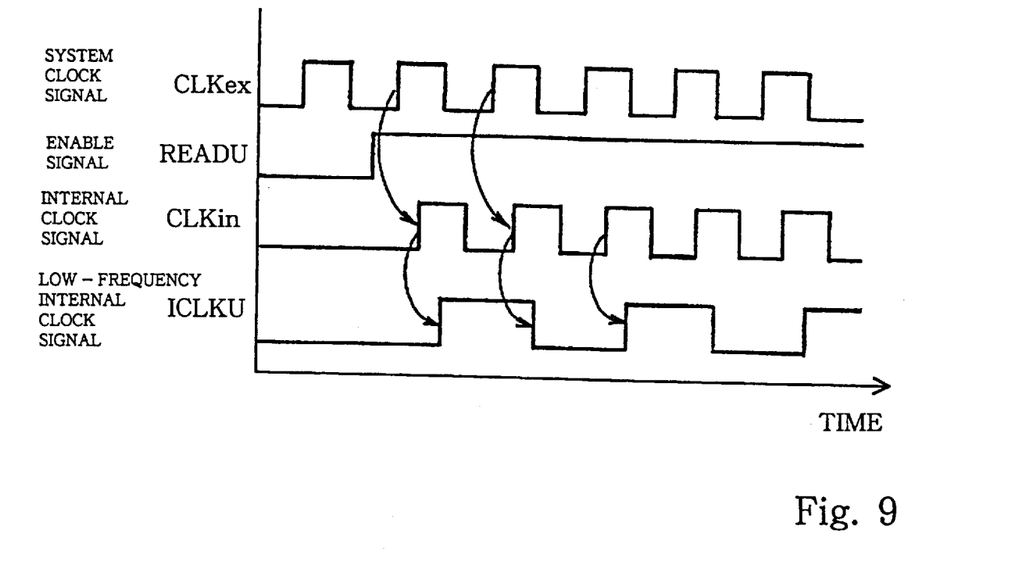
FIG. 9 is a graph showing the waveform of an internal clock signal produced from a frequency divider incorporated in the semiconductor synchronous dynamic random access memory device.

The frequency divider 31 forms a step-up voltage distributing system 32 together with the ring oscillator 23a and the boosting circuits 23b/23c, and prolongs the pulse period twice as long as the internal clock signal CLKin. The frequency divider 31 may be implemented by D flip-flop circuits. The system clock signal CLKex is supplied to the internal clock generator 21, and the internal clock generator 21 is enabled with the enable signal READU so as to produce the internal clock signal CLKin. The internal clock signal CLKin is equal in frequency in the system clock CLKex as shown in FIG. 9. The internal clock signal CLKin is supplied to the frequency divider 31, and the frequency divider 31 produces a low-frequency internal clock signal ICLKU from the internal clock signal CLKin. The boosting circuit 23c is responsive to the low-frequency internal clock signal ICLKU so as to increase the power voltage level.

The step-up voltage distributing system 32 is desirable for a high-speed burst access. A semiconductor synchronous dynamic random access memory device is responsive to a system clock more than 100 MHz for a burst access. However, such a high-speed system clock CLKex is too fast to obtain the boosted voltage level Vboot2. Because, the high-speed system clock signal CLKex is changed to the ground level before the bootstrap capacitor C2/C3 sufficiently boosts the potential level at the boosting nodes N2/N3 (see FIG. 2). With the low-frequency internal clock signal ICLKU, the boosting circuit 23c sufficiently boosts the power voltage level Vcc to the boosted voltage level Vboot2. The frequency divider 31 reduces the low-frequency internal clock signal ICLKU to a certain frequency, which allows the boosting circuit 23c to boost the power voltage to the boosted voltage level Vboot2.

Third Embodiment

Figure 10:
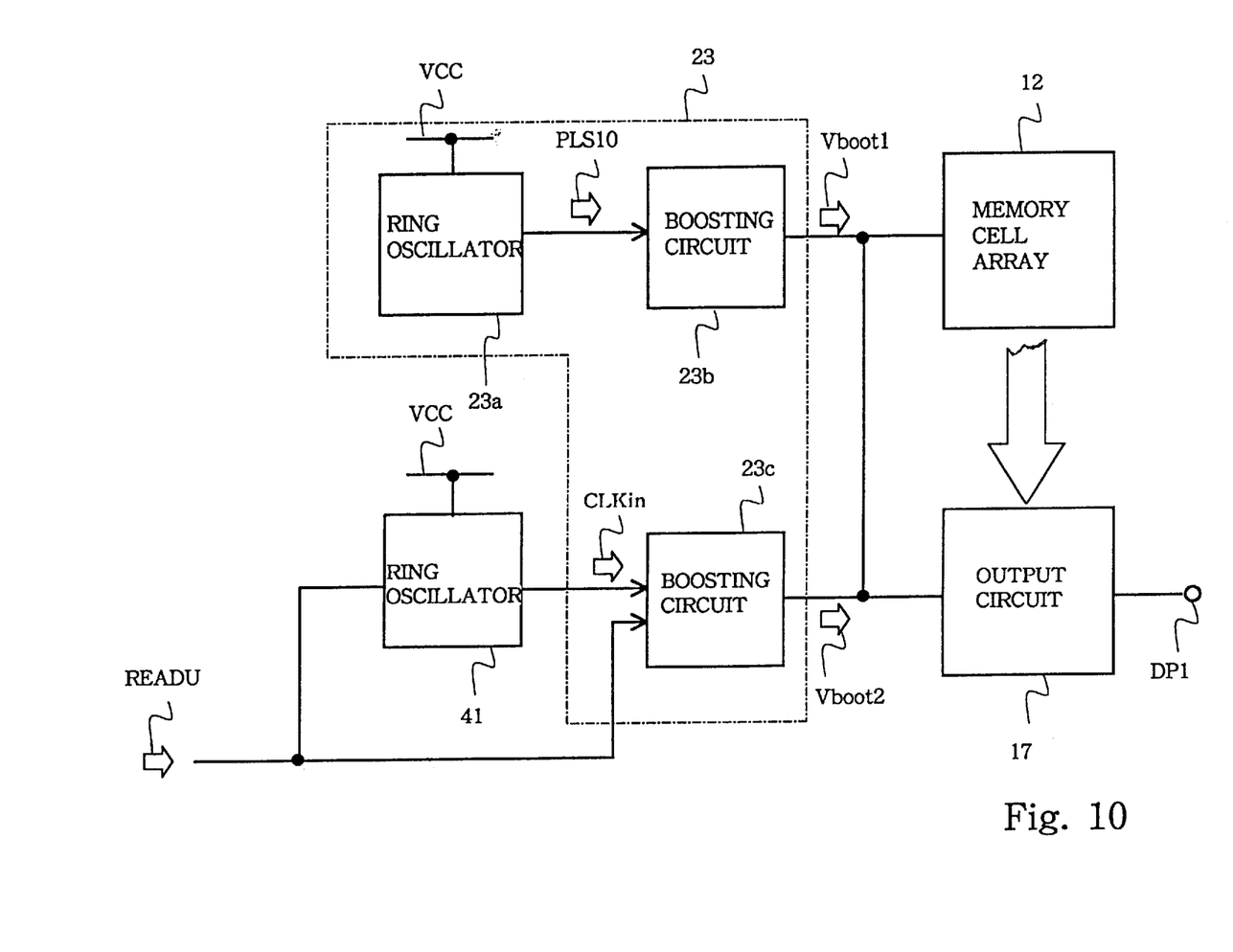
FIG. 10 is a block diagram showing the arrangement of yet another semiconductor synchronous dynamic random access memory device according to the present invention.

FIG. 10 illustrates yet another semiconductor synchronous dynamic random access memory device embodying the present invention. The semiconductor synchronous dynamic random access memory device implementing the third embodiment is similar in arrangement to the first embodiment except for a ring oscillator 41. For this reason, the other components are labeled with the same references designating corresponding components of the first embodiment without detailed description. Although the memory cell array 12 is directly connected to the output circuit 17 in FIG. 8, the memory cell array 12 is accompanied with the above described circuits as similar to the first embodiment.

In this instance, the internal clock generator 21 is replaced with the ring oscillator 41. The ring oscillator 41 and the boosting circuit 23c are enabled with the enable signal READU, and the ring oscillator 41 supplies the internal clock signal CLKin to the boosting circuit 23c as similar to the other boosting circuit 23b. The system clock CLKex is not always available for the boosting operation. In this instance, the scheme shown in FIG. 10 is appropriate, and the boosting circuit 23c keeps the boosted voltage at the certain level during the burst access.

Although particular embodiments of the present invention have been shown and described, it will be obvious to those skilled in the art that various changes and modifications may be made without departing from the spirit and scope of the present invention.

For example, the dual boosting circuit according to the present invention is applicable to any kind of high-speed memory device in so far as it requires a boosted voltage. In other words, the present invention is never limited to the semiconductor synchronous dynamic random access memory device.

The frequency divider is adopted to adjust the low-frequency internal clock signal ICLKU to a suitable value allowing the boosting circuit 23c to lift the power voltage to the boosted voltage Vboot2. For this reason, the frequency ratio is never limited to ½.

What is claimed is:

1. A semiconductor memory device comprising
a first component including a plurality of addressable memory cells for respectively storing data bits,
a second component connected to said first component for transferring said data bits between said first component and the outside of said semiconductor memory device, and
a third component including
a first step-up circuit connected to said first component and producing a first step-up voltage higher than an external power voltage for supplying said first step-up voltage from an output node thereof to said first component,
a second step-up circuit connected to said second component and producing a second step-up voltage higher than said external power voltage for supplying said second step-up voltage from an output node thereof to said second component and
a conductive line electrically connecting said output node of said first step-up circuit and said output node of said second step-up circuit.

2. The semiconductor memory device as set forth in claim 1, in which each of said first and second step-up circuits has a bootstrap means for boosting said output node thereof to said first or second step-up voltage.

3. The semiconductor memory device as set forth in claim 2, in which said third component further includes a ring oscillator connected to said bootstrap means of said first step-up circuit for supplying a first clock signal thereto for boosting said output node to said first step-up voltage and an internal clock generator activated during a burst access and responsive to a system clock for producing a second clock signal supplied to said bootstrap means of said second step-up voltage, and said first component further includes a burst accessing means responsive to said system clock so as to serially supply said data bits to said second component during said burst access.

4. The semiconductor memory device as set forth in claim 3, in which said third component further includes a frequency divider connected between said internal clock generator and said second step-up circuit, producing a secondary internal clock signal lower in frequency than said internal clock signal and supplying said secondary internal clock signal to said bootstrap means of said second step-up circuit.

5. The semiconductor memory device as set forth in claim 2, in which said third component further includes a first ring oscillator connected to said bootstrap means of said first step-up circuit for supplying a first clock signal thereto for boosting said output node to said first step-up voltage and a second ring oscillator connected to said bootstrap means of said second step-up circuit and activated in a burst access so as to supply a second clock signal thereto for boosting said output node to said second step-up voltage, and said first component further includes a burst accessing means responsive to a system clock so as to serially supply said data bits to said second component during said burst access.

6. The semiconductor memory device as set forth in claim 2, in which said bootstrap means has a pair of bootstrap capacitors respectively driven by a first clock signal and a second clock signal complementary to said first clock signal.

7. The semiconductor memory device as set forth in claim 6, in which the bootstrap capacitors of said first step-up circuit are associated with a ring oscillator and supplied with said first clock signal and said second clock signal both produced from a third clock signal produced by said ring oscillator, and the bootstrap capacitors of said second step-up circuit are associated with an internal clock generator activated in a burst access and supplied with said first clock signal and said second clock signal both produced from a fourth clock signal produced from a system clock by said internal clock generator, said first component further including a burst accessing means responsive to said system clock so as to serially supply said data bits to said second component during said burst access.

8. The semiconductor memory device as set forth in claim 7, in which said third component further includes a frequency divider connected between said internal clock generator and said second step-up circuit producing a secondary internal clock signal lower in frequency than said internal clock signal and supplying said secondary internal clock signal to said pair of bootstrap capacitors of said second step-up circuit.

9. The semiconductor memory device as set forth in claim 6, in which the bootstrap capacitors of said first step-up circuit are associated with a first ring oscillator and supplied with said first clock signal and said second clock signal both produced from a third clock signal produced by said ring oscillator, and the bootstrap capacitors of said second step-up circuit are associated with a second ring oscillator activated in a burst access and supplied with said first clock signal and said second clock signal both produced from a fourth clock signal produced by said second ring oscillator, said first component further including a burst accessing means responsive to a system clock so as to serially supply said data bits to said second component during said burst access.

10. The semiconductor memory device as set forth in claim 1, in which each of said plurality of addressable memory cells is implemented by a dynamic memory cell.

\* \* \* \* \*